(12) United States Patent
Paquet

(10) Patent No.: US 6,842,134 B2
(45) Date of Patent: Jan. 11, 2005

(54) HIGHLY ACCURATE DIGITAL TO ANALOG CONVERTER

(75) Inventor: Francois J. Paquet, Nepean (CA)

(73) Assignee: Her Majesty the Queen in right of Canada, as represented by the Minister of National Defence, Ottawa (CA)

( * ) Notice: Subject to any disclaimer, the term of this patent is extended or adjusted under 35 U.S.C. 154(b) by 0 days.

(21) Appl. No.: 10/655,015

(22) Filed: Sep. 5, 2003

(65) Prior Publication Data

US 2004/0046682 A1 Mar. 11, 2004

(30) Foreign Application Priority Data

Sep. 6, 2002 (CA) .............................................. 2401482

(51) Int. Cl.[7] .............................................. H03M 1/82
(52) U.S. Cl. ..................... 341/152; 341/144; 341/143
(58) Field of Search ................................ 341/152, 144, 341/136, 143

(56) References Cited

U.S. PATENT DOCUMENTS

| | | | | |
|---|---|---|---|---|
| 4,099,109 A | * | 7/1978 | Abbondanti | 318/811 |
| 5,617,058 A | * | 4/1997 | Adrian et al. | 330/10 |
| 5,754,072 A | * | 5/1998 | Mazzetti | 327/291 |
| 6,486,816 B2 | * | 11/2002 | Seymour | 341/150 |
| 6,522,278 B1 | * | 2/2003 | Rhode et al. | 341/144 |
| 6,563,447 B1 | * | 5/2003 | Schofield | 341/136 |
| 6,727,832 B1 | * | 4/2004 | Melanson | 341/143 |

* cited by examiner

*Primary Examiner*—Jean Bruner Jeanglaude
(74) *Attorney, Agent, or Firm*—Freedman & Associates (57) ABSTRACT

Disclosed is a D/A converter including a DC processing circuit, an analog switching device, a bootstrap circuit, and a third order low-pass filter. The boots trap circuit substantially reduces loading created by the low-pass filter circuit and acting on the switching device. Cross-over discontinuities in the continuous analog signal are reduced by interposing between each two successive pulses a cross-over correction pulse having opposite polarity and a predetermined fixed pulse-width. The D/A converter provides fast and accurate response over a long period of time.

30 Claims, 4 Drawing Sheets

HIGHLY ACCURATE DIGITAL TO ANALOG CONVERTER

FIELD OF THE INVENTION

This invention relates to digital to analog conversion of signals and in particular to a highly accurate digital to analog converter using pulse width modulation for space applications.

BACKGROUND OF THE INVENTION

A digital to analog (D/A) converter is a device that generates an analog voltage signal in response to its digital representation. Typically, the accuracy of a state-of-the-art D/A converter is related to the resolution of the digital signal representation. For example, an 8-bit D/A converter generates up to 256 different discrete voltage values to recreate the signal and, therefore, the accuracy to reproduce each of these voltage values is sufficient to provide approximately equal increments between contiguous voltage values, about ±one half increment, or in this example, about ±0.2% of the full scale. But for applications involving integration, such as in the control of inertial sensors, accelerometers and gyroscopes, the analog accuracy and stability is much more important than the resolution. Because of this, D/A converters using pulse width modulation are well suited for these applications.

However, the accuracy of the state of the art D/A converters using pulse width modulation is affected by numerous factors resulting in errors. For example, the response of the state of the art D/A converters is inherently non-linear caused by the resistance imbalance in the switching device of the converter. Even if an initial resistance imbalance is removed by factory adjustment, a resistance imbalance typically appears in time as a result of aging and, particularly in space applications, of radiation. Such non-linearity in the response results in errors of several PPM's. Another source of error is the high sensitivity to the reference voltages and to propagation delays in D/A converters using pulse width modulation to switch between two reference voltages equal in value but of opposite polarities. The errors of each reference voltages, drifts and mismatch, combine to create errors in the output. Propagation delay errors that affect the duty cycle have full impact on the accuracy of the output. When the output voltage is small, these errors will appear that much greater in relative terms. To reduce these sensitivities and increase the accuracy a 2 bit digital signal is used to provide two pulse width modulations instead of just one to switch between zero volt and one of the reference voltages, either positive or negative depending on the polarity of the voltage to be created. This is much more accurate especially for small near zero output voltages. A new source of error arises from this, albeit less serious than the problem this double modulation seeks to reduce. This other source of error is cross-over discontinuity. At every switching operation there is a small difference of propagation time delay between the time the switches respond to a turn ON command and the time it responds to a turn OFF command resulting in a pulse deficit or excess which is constant for each modulation or polarity but differs from one polarity to the other. The differing pulse deficits/excesses for different polarities result in so-called cross-over discontinuity in the averaged signal when passing from one polarity to the other, substantially affecting the accuracy of the filtered signal. Yet another source of error voltage drift normally associated with the use of an operational amplifier in the low-pass filter.

However, for certain applications such as the control of gyroscopes and accelerometers in space applications it is necessary to employ a D/A converter that offers a relatively fast response and a very accurate response over a longer period of use.

It would be advantageous to provide a very accurate D/A converter that overcomes some of the known drawbacks of the prior art through circuit design using parts that are readily available in radiation hardened versions.

It is, therefore, an object of the invention to provide a D/A converter based on a circuit design that overcomes the drawbacks of the prior art using parts that are readily available in radiation hardened versions.

It is further an object of the invention to provide a modulation scheme for eliminating cross-over discontinuity when passing from one polarity to the other.

SUMMARY OF THE INVENTION

In accordance with the present invention there is provided highly accurate D/A converter comprising:

a DC processing circuit for providing highly accurate voltage levels including a zero voltage level and two highly accurately mirrored voltages forming a positive voltage, and a negative voltage;

a switching device in electrical communication with the DC processing circuit, the switching device for receiving a digital signal and for selectively connecting to one of the voltage levels in dependence upon the digital signal in order to produce an output signal, the output signal being a series of highly accurate positive, zero, and negative voltage levels;

a low-pass filter circuit in electrical communication with the switching device, the low-pass filter for receiving the output signal and for averaging the output signal in order to create a continuous analog output signal; and, a bootstrap circuit interposed between the switching device and the low-pass filter circuit for substantially reducing loading created by the low-pass filter circuit and acting on the switching device.

In accordance with the present invention there is further provided a third order low-pass filter comprising:

a primary and a secondary input port for receiving an input signal;

an output port for providing a third order low-pass filtered output signal;

a first order filter circuit comprising:

a resistor R16 interposed between the primary input port and the output port; and, a capacitor C8 connected to a first node, the first node interposed between the resistor R16 and the output port; and, a second order filter circuit comprising:

an amplifier having a direct input port, an inverse input port, and an output port, the direct input port being connected to ground, the inverse input port being connected via a resistor R15 to the secondary input port, and the output port being connected to the capacitor C8 for providing a second order response thereto;

a first loop connecting the output port of the amplifier to the inverse input port via a resistor R17; and, a second loop connecting the output port of the amplifier to the inverse input port via capacitors C9 and C10, the second loop being connected to ground between the capacitors C9 and C10 via a resistor R18.

In accordance with an aspect of the invention there is provided a method for pulse-width modulating a digital signal for generating a continuous analog signal therefrom comprising the steps of:

receiving the digital signal;

generating a pulse train including a series of pulses having a fixed reference amplitude and being separated by intervals of zero amplitude such that a given instantaneous value of the digital signal is represented by pulse polarity and the pulse-width with regard to a width of the following zero amplitude interval; and, interposing between each two successive pulses a cross-over correction pulse having opposite polarity and a predetermined fixed pulse-width in order to eliminate cross-over discontinuity in the continuous analog signal.

In accordance with another aspect of the invention there is provided a method for converting a digital signal into a continuous analog signal comprising the steps of:

receiving the digital signal;

generating an analog pulse train including a series of pulses being separated by intervals of zero amplitude such that a given instantaneous value of the digital signal is represented by pulse polarity and the pulse-width with regard to a width of the following zero amplitude interval;

interposing between each two successive pulses of the analog pulse train a cross-over correction pulse having opposite polarity and a predetermined fixed pulse-width in order to eliminate cross-over discontinuity in the continuous analog signal;

selectively connecting to highly accurate positive, zero, and negative voltage levels in dependence upon the digital signal generating an analog pulse train of highly accurate positive, zero, and negative voltage levels; and, averaging the analog pulse train in a low-pass filter circuit in order to create a continuous analog output signal.

BRIEF DESCRIPTION OF THE FIGURES

Exemplary embodiments of the invention will now be described in conjunction with the following drawings, in which.

DETAILED DESCRIPTION OF EMBODIMENTS OF THE INVENTION

A D/A converter according to the embodiment of the invention set out below provides a relatively fast response and a very accurate response over a long period of time. A bootstrap circuit interposed between the switching device and the low-pass filter substantially reduces loading created by the low-pass filter circuit and acting on the switching device. Therefore, an inherent non-linearity of the response caused by a resistance imbalance in the switching device is substantially reduced. Furthermore, a new modulation method is used to eliminate occurrence of cross-over discontinuity in the continuous analog signal by interposing between each two successive pulses a cross-over correction pulse having opposite polarity and a predetermined fixed pulse-width.

For some applications such as control of gyroscopes and accelerometers in satellites, it is necessary to employ a D/A converter that offers a relatively fast response and a very accurate response over a long period of time. The relatively simple D/A converter circuit described hereinbelow relies on parts that are readily available, and more particularly parts that are readily available in radiation hardened versions for space applications such as control of gyroscopes and accelerometers in satellites. It will become apparent to those of skill in the art that use of the D/A converter is not limited to space applications but is highly advantageous in numerous applications where one or both of high accuracy and longevity is desired.

Figure 1:
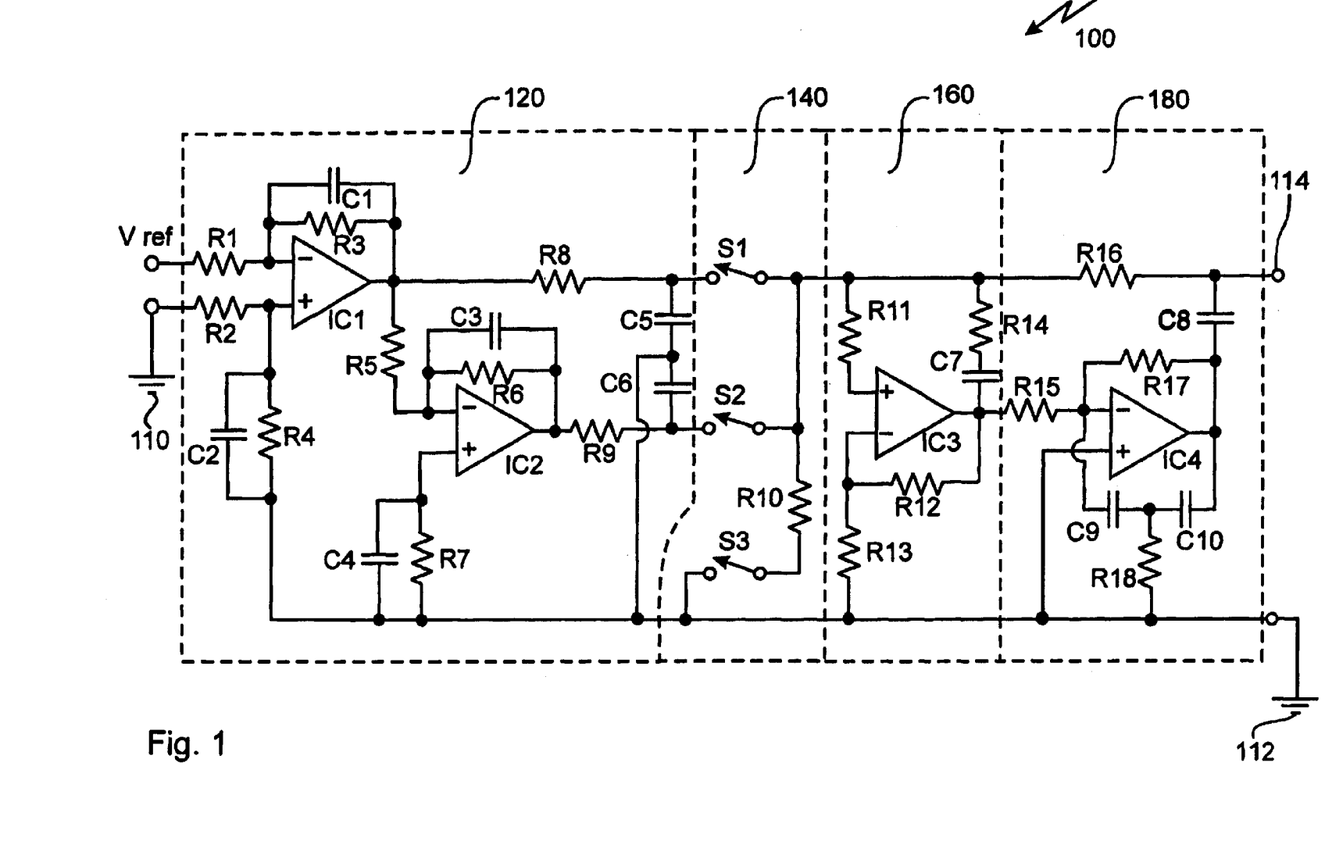
FIG. 1 is a simplified circuit diagram illustrating a D/A converter according to the invention.

Referring to FIG. 1, a preferred embodiment of the D/A converter according to the invention is shown. The D/A converter 100 comprises four main building blocks, indicated by dashed lines. These four main building blocks are—in logical order of their operation—a DC processing circuit 120, an analog switching device 140, a bootstrap circuit 160, and a high order low-pass filter 180.

The basic operation of the D/A converter 100 is as follows. A 2-bit digital signal is provided in the logical form of two pulse width modulated digital pulse trains—one for each polarity of the analog signal—and in the physical form of 3 digital pulse trains, with varying duty cycles. These so-called pulse trains are provided to the analog switching device 140 for controlling a 3-way switch to selectively connect to one of 3 highly accurate constant voltage levels provided by the DC processing circuit 120. The voltage levels include a zero voltage, and two highly accurately mirrored voltages forming a positive voltage, and a negative voltage. The output of the analog switching device 140 is a signal comprising a series of highly accurate positive, zero, and negative voltage levels. From this, a continuous analog signal is created by the averaging effect of the low-pass filter 180 as affected by the bootstrap circuit 160. The bootstrap circuit 160 substantially reduces an inherent non-linearity of the response caused by a resistance imbalance in the switching device 140. Even if an initial resistance imbalance is removed by factory adjustment, a resistance imbalance typically appears in time as a result of aging and radiation.

The DC processing circuit 120, shown in FIG. 1, provides a set of highly accurate mirrored constant voltages on switches S1 and S2 of the analog switching device 140. IC1 is a balanced differential amplifier, whereas IC2 is an inverter amplifier for producing a mirrored voltage of the output of IC1. The reference ground used for the circuit is not the same as the input ground 110. In numerous applications one voltage reference input is shared by several channels—each channel provided with a D/A converter—, the ground used by the input voltage reference is common to all D/A converters while the ground used by each one D/A converter circuit is a sense ground 112 for this circuit only such as a remote ground reference node in a coil driver circuit dedicated to the D/A converter. Because IC1 is balanced—R3/R1=R4/R2—a small voltage difference between the sense ground 112 and the input ground 110 does not introduce a significant error in the voltages provided to S1 and S2 with respect to the sense ground 112. Capacitors C5 and C6 provide a low impedance for switches S1 and S2 in order to ensure a constant voltage when S1 or S2 closes. Resistors R8 and R9 are interposed to prevent oscillations in IC1 and IC2 caused by the capacitive loading of capacitors C5 and C6.

The three switches S1, S2, and S3 of the analog switching device 140 are controlled by a digital circuit such as a field-programmable gate array (FPGA) and are, for example, part of a quad-switch C-MOS integrated circuit. State-of-the-art digital circuits are common and commercially available. The digital circuit used for controlling the switches S1, S2, and S3 is designed in accordance with the frequency response of the low-pass filter 180 such that a ripple corresponding to the switching frequency components is filtered out. For example, the digital circuit is designed such that a switching cycle has a duration of about 0.4 milliseconds. In addition, to achieve maximum accuracy the duty cycle is controlled with a high degree of precision. This is achievable with ordinary synchronized digital circuits when command signals are accurate to a nanosecond, even in the case when these circuits are not particularly fast in switching. The switches S1, S2, and S3 are switched in dependence upon the digital pulse trains provided to the switching device 140. The pulse trains are used to control the three switches S1, S2, and S3 to selectively connect to one of 3 highly accurate constant voltage levels, for example, S1 to +5 V, S2 to −5 V, and S3 to 0 V. The result of the switching is a signal comprising a series of highly accurate positive and negative voltage levels including zero. From this, the continuous analog signal is generated by averaging using the low-pass filter 180 bootstrapped with the bootstrap circuit 160. The switching frequency components are eliminated and the signal varies smoothly within the range limits. The determination of any instantaneous voltage in the signal is given by the duty cycle in the pulse-width modulation. For example, if the duty cycle for the positive polarity is 75%, the voltage is switched 75% of the time to the positive voltage reference (+5 V) and 25% of the time to zero volt, therefore, the resulting filtered output voltage is +3.75 V. In operation, there is at any given time only one switch ON and there is always one switch ON, besides a small gap or overlap of approximately one nanosecond.

A simple prior art pulse-modulation scheme is, for example, for determining a positive voltage by varying the duty cycle on S1 while the duty cycle on S2 is zero and vice versa. The sequence for determining voltages starting from a positive voltage to a negative voltage is for example, S2-S3-S2-S3-S2-S3-S3-S3-S3-S3-S1-S3-S1-S3-S1-S3 .... At every switching operation there is a small difference of propagation time delay between the time the switch responds to a turn ON command and the time it responds to a turn OFF command resulting in a pulse deficit or excess which is constant for each modulation but differs from one polarity to the other. This results in three error terms—offsets—to correct, one for positive voltages, one for negative voltages, and one for zero volt, when there is no pulse. The differing pulse deficits/excesses for different polarities result in so-called cross-over discontinuity in the averaged signal when passing from one polarity to the other substantially affecting the accuracy of the filtered signal. The cross-over discontinuity is eliminated by the pulse-width modulation scheme according to the invention which is explained hereinbelow.

Figure 2:
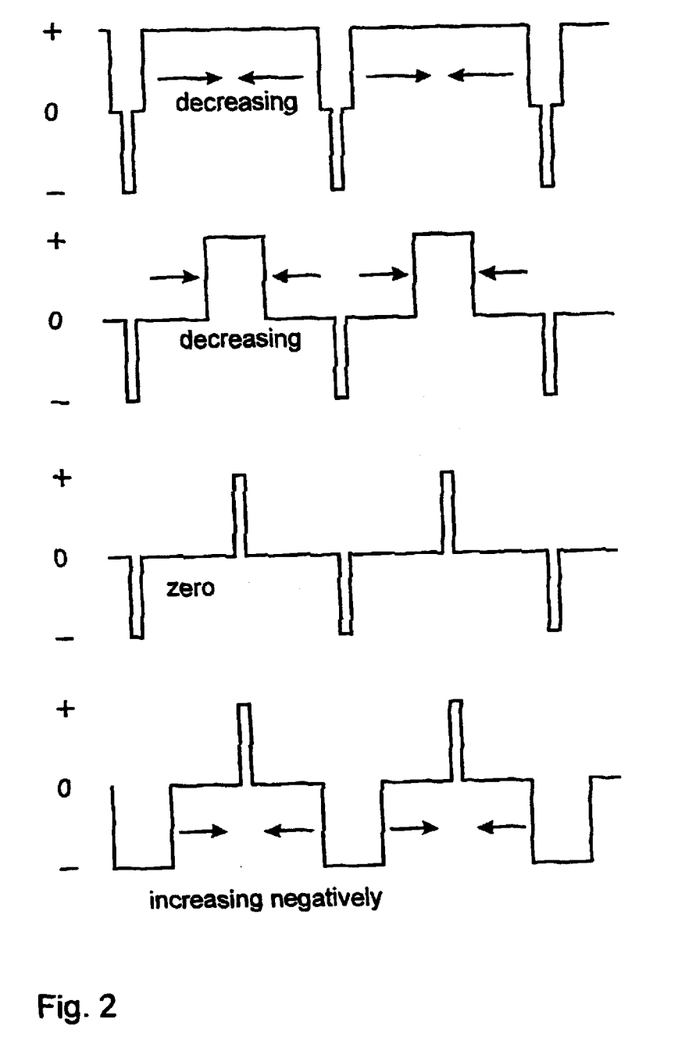
FIG. 2 is a simplified diagram illustrating a pulse train generated using a pulse-width modulation scheme according to the invention.

FIG. 2 illustrates an example of a sequence of duty cycles using the pulse-modulation scheme according to the invention starting from a large positive voltage and proceeding toward a negative voltage. The sequence is, in this case, S2-S3-S1-S3-S2-S3-S1-S3 .... As illustrated in FIG. 2 there is always a minimum pulse width of, for example, 0.5 μs in either polarity. Therefore, the pulse deficit/excess is constant in the whole bipolar range and is the sum of the pulse deficit/excess in S1 and the pulse deficit/excess in S2, thus eliminating cross-over discontinuity. The only correction required is one single offset term which is calibrated and then corrected as part of the system offset.

The output signal of the switching device 140 applied on R11 and R16 is a pulse train highly accurately switching between zero volts and two mirrored voltage levels at very precise times. The high order low-pass filter 180 filters—averages—the pulse train signal to form a smooth voltage signal in dependence thereupon. The bootstrap circuit 160 provides a buffer for the filter 180. The filter 180 processes the signal received from the bootstrap circuit 160 and combines it with the signal from R16 via capacitor C8. When combined, a smooth voltage signal corresponding to the pulse train is generated and the ripple within the input signal is cancelled. The response of the filter 180 is that of a third order filter resulting in a high degree of ripple smoothing. To further reduce the ripple a small adjustment is made in the filter circuit 180 to create a notch in the frequency response. Details of the filter 180 are described further hereinbelow. Because the analog output voltage signal is not directly formed by IC4, any drift of IC4 is blocked by capacitor C8. Therefore, the accuracy of the analog output voltage signal is not affected by the drift of IC4.

The main function of the bootstrap circuit 160 is to create a bootstrap for eliminating loading of the low-pass filter 180 on the switches S1, S2, and S3. Loading the switches S1, S2, and S3 creates an error due to unequal internal ON resistance of each switch. The ON resistances of the switches become unequal due to aging and due to radiation effects in space. The cause of the error is eliminated by the bootstrap circuit 160. This is achieved by the amplifying action of IC3 creating a current in R14 equal to the demand of current by C8 flowing through R16. The current is bootstrapped in the circuit 160 and does not need to be supplied by the switches effectively removing the load thereon. It is possible to use a commercially available low cost integrated circuit for IC3. The efficiency of the bootstrap circuit 160 is not significantly affected by a transition time for IC3 that is much slower than the transition times for the switching device 140, which are in the order of 10 nanoseconds. Preferably, however, the transition time from IC3 is small compared to the modulation period, such as half of a microsecond versus 400 microseconds. This requirement is easily satisfied using a low-cost, moderately fast and low power op amp for IC3. This is highly advantageous, avoiding use of a very fast op amp that is expensive and produces a significant amount of thermal energy. Excess heat generation is generally solved through cooling which can be more problematic for space applications. Furthermore, any DC drift generated by IC3 is blocked by capacitor C7.

Figure 3:
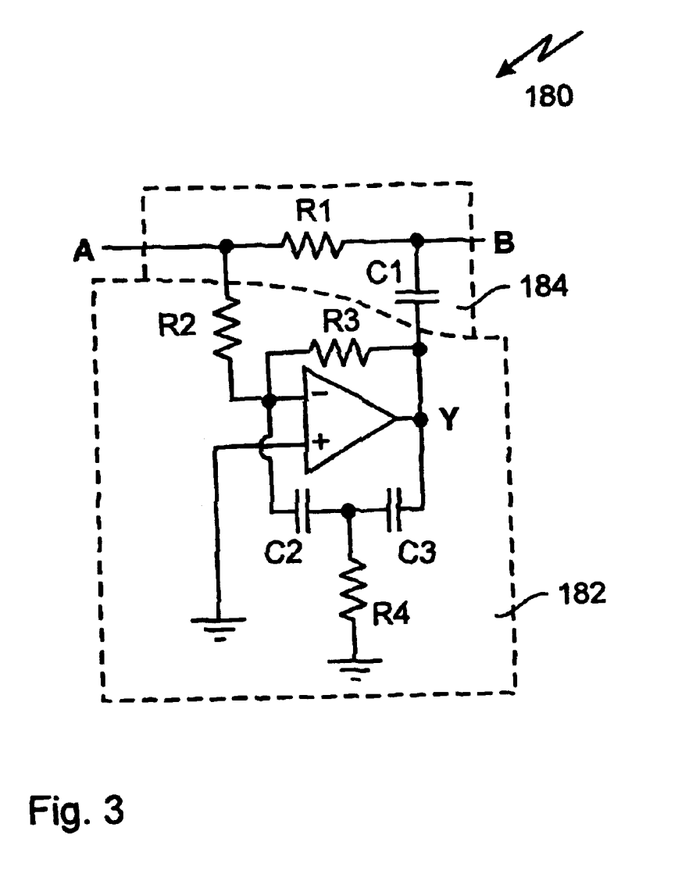
FIG. 3 is a simplified circuit diagram illustrating a third order low-pass filter according to the invention; and, FIG. 4 is a frequency diagram illustrating a frequency response of the third order low-pass filter shown in FIG. 3.

Referring to FIG. 3 a circuit diagram of a third order low-pass and notch filter 180 according to the invention is shown. The third order low-pass filter is a combination of a second order low-pass filter 182 and a first order low-pass filter 184 connected in parallel rather than in cascade. Input port and output port of the filter 180 are indicated by A and B, respectively. IC4 forms a second order response in Y/A. The response at B is a superposition of a first order response of R1C1 and the second order response at Y high-pass filtered by R1C1. A main feature of this circuit is that there is no voltage drift of the op-amp—IC4—appearing at the output port. Another advantage is the virtual ground input port of the op-amp, facilitating adjustment of R2. The DC gain of Y/A is given by R3/R2. R4 is added to produce a desired resonance providing a second order response in Y/A. This effect is frequency limited and, therefore, at relatively high frequencies the filter 182 acts as a first order filter at Y. The unexpected third order frequency response of the filter circuit 180, in view of prior art teachings of electrical circuits, will become apparent to those of skill in the art from the following Laplace transform analysis of this circuit. The frequency response of the filter circuit 180 is:

$$\frac{B}{A} = \frac{R3R4(C2C3 - (R1C1(C2+C3)/R2))S^2 + (R4(C2+C3) - R1R3C1/R2)S + 1}{R1R3R4C1C2C3S^3 + (R1R4C1C2 + R1R4C1C3 + R3R4C2C3)S^2 + (R1C1 + R4(C2+C3))S + 1} \quad (1)$$

clearly indicating the third order frequency response of the filter circuit 180. In the following the frequency response is analyzed in view of the design of a low-pass notch filter according to the invention. Assuming $R2C2C3/(C2+C3) = R1C1$ and $R4(C2+C3) = R3C2C3/(C2+C3)$, equation (1) reads as follows:

$$\frac{B}{A} = \frac{1}{R1R3R4C1C2C3S^3 + (R1R4C1C2 + R1R4C1C3 + R3R4C2C3)S^2 + (R1C1 + R4C2 + R4C3)S + 1} \quad (2)$$

resulting in a simplified version of equation (1) illustrating that the circuit 180 has the potential to have the simplest form of third order response which is well suited for low-pass filtering.

A method for analyzing the response of equation (2) is using the Laplace transform of Y/A:

$$\frac{Y}{A} = -\frac{R3}{R2} \frac{(C2+C3)R4S + 1}{R3R4C2C3S^2 + (C2+C3)R4S + 1} \quad (3)$$

For a perfect filter having B/A=0 in the stop band a perfect integrator response is needed at point Y:

$$\frac{1}{R1C1S + 1} - \frac{1}{R1C1S} \frac{R1C1S}{(R1C1S+1)} = 0 \quad (4)$$

i.e. a "no-pass filter". If the input is a square wave, the waveform at point Y should be a triangular wave at the frequencies rejected. Therefore, the term R2C2C3/(C2+C3) is set to be equal to R1C1. When R3 and R4 are infinite, a no-pass filter results; with a finite R3, a first order response in Y/A and a second order response in B/A results; and with a finite R4 the orders of the responses are each increased by one. For a square wave as an input signal, the waveform at point Y is a triangular wave in order to notch-out the signal and its harmonics. Because a no-pass filter is not desired, the triangular wave is other than perfect. The triangular wave is low in the pass-band, which is achieved using R3, but is only approximate at the notch frequency. The effect of R4 is to linearize the triangular wave at the notch frequency, thus R4 compensates for the effect of R3 in this respect.

It is possible to separate the ideal integrator response from the remaining response—the residue—of Y/A:

$$\frac{Y}{A} = -\frac{R3}{R2} \frac{(C2+C3)R4S + 1}{R3R4C2C3S^2 + (C2+C3)R4S + 1} = \frac{1}{(C2C3/(C2+C3))R2S} + RESIDUE \quad (5)$$

From equation (5) we find:

$$RESIDUE = \frac{((C2C3/(C2+C3))R3 - (C2+C3)R4)S - 1}{(R3R4C2C3S^2 + (C2+C3)R4S + 1)(C2C3/(C2+C3))R2S} \quad (6)$$

The following equation expresses the ratio of the residue to the ideal integrator response:

$$\frac{RESIDUE}{IDEAL} = \frac{((C2C3/(C2+C3))R3 - (C2+C3)R4)S - 1}{R3R4C2C3S^2 + (C2+C3)R4S + 1} \quad (7)$$

At the frequency where a notch is desired, if the ratio of equation (7) is real, the residue is in phase with the ideal integrator response and adjustment of R2—gain—creates the notch. The ratio is approximately real as long as the term of $S^2$ is very large compared to the term of S in the denominator and when the nominator is equal to −1 by setting R4 such that $R4(C2+C3) = R3C2C3/(C2+C3)$. Since the ratio is positive, the total signal is too large and, therefore, the gain must be reduced. The value of the ratio sets the adjustment R2:

$R2_{new} = R2_{old}(1 + \text{equation (7)})$.

When the frequency is not high enough for this approximation, R4 is adjusted such that the ratio in equation (7) is exactly real. Only when the ratio expressed in equation (7) is real it is possible to create a deep notch by increasing the resistance of R2.

The circuit design of the low-pass notch filter is explained with reference to the following example. The first step in designing the filter is the creation of a third order low-pass filter without a notch. This is a starting point in determining the resistance R2 for creating a desired notch with satisfactory filtering of the carrier harmonics in the stop-band, a high cut-off frequency, and a low phase lag in the pass-band.

Assuming R1=15 KOhm, C1, C2, C3=0.05 $\mu$F, and a desired notch frequency of 2.4 KHz, and satisfying $R2C2C3/(C2+C3) = R1C1$ and $R4(C2+C3) = R3C2C3/(C2+C3)$, R2=30 KOhm and R4=0.25 R3. In order to get a damping ratio of 0.5 in the Y/A response, by definition of the general second order response, R3 is set to 0.7 times R2=22 KOhm, and R4=5.5 KOhm.

To set the scaling of the filter relative to the notch frequency, i.e. the ratio between the notch frequency and other frequency parameters in the circuit, an acceptable amount of ripple is determined. Based on an error analysis of the bootstrap circuit with regards to the effect of ripple, in the present embodiment it is determined that the amplitude of the triangular wave in the stop-band should be approximately 0.015V P-P from a square wave input signal of 5.5V P-P at a frequency of approximately 4 KHz. The value of ripple, 0.015 V P-P, has been chosen as being one tenth of the ripple large enough to cause an error equal to the sum of all the other errors of the bootstrap circuit 160. The amplitude of only the first order filter 184—R1C1, i.e. Y=0, is approximately: 125 $\mu$sec× 2.7V/RC=0.45VP-P. A notch in the filter response is created by decreasing the gain in Y/A. The increase of R2 is given by: 1/(1−(0.015/0.45))=1.034, therefore the value for R2 is 31 KOhm.

To satisfy having a null S term in the numerator of the B/A Laplace transform, R4 is adjusted. The new value for R4 is then determined as: R4=R3R1C1/(R2(C2+C3)), thus $R4_{new} = R4_{old}/1.034 = 5.32$ KOhm.

It is possible to rescale the values of R3 and R4 slightly as long as the ratios R3/R4 and R2/R1 are unchanged and the ratio R3/R2 remains approximately equal to 0.7. This affects the phase lag but not the notch frequency. Of course small variations in the ratios are also possible but typically are not preferred.

Using the $S^2$ term in the numerator of equation (1), the notch frequency is determined. In a following step the values are rescaled for a notch frequency of 2.4 KHz. The response is zero when this term of $S^2$ is equal to $-1$.

Given $R3R4(C2C3-(R1C1(C2+C3)/R2))S^2=-1$ and $R4=R3R1C1/(R2(C2+C3))$, we find:

$$F_{notch}=1/(2\pi(R3R1C1\sqrt{(K-1)}/R2)),$$

wherein K is the factor used to increase R2 to create the notch. With $K=1.034$, $F_{notch}=1.622$ KHz. In order to obtain a notch at 2.4KHz, either all capacitances or all resistors are divided by the ratio $2.4/1.622=1.48$.

It is noted that when applied to the D/A converter circuit shown in FIG. 1 the value of R2—corresponding to R15 in the circuit diagram shown in FIG. 1—is multiplied by $1+(R12/R13)$ to retain the gain constant since the input of IC4 is connected to the bootstrap circuit, which has a gain greater than unity.

Figure 4:
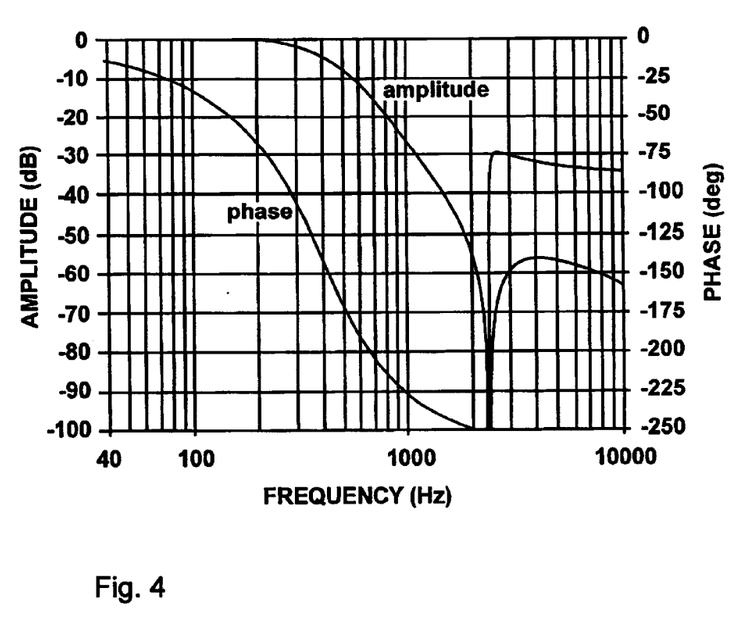

Solving the Laplace transform for B/A—equation (1), the frequency response, shown in FIG. 4, of the low-pass notch filter is determined. It is noted that there is a swing of the phase from below $-250°$ to above $-75°$ at the notch frequency. This is advantageous because it is beneficial for the efficiency of the bootstrap circuit 160 that the phase in this region is in quadrature, either $-270°$ or $-90°$. The reason for this is that a sinusoidal current in exact quadrature does not need to be bootstrapped since it produces no net DC current in each of the switches.

An experimental prototype was constructed and proved capable of generating signals up to 400 Hz with a DC accuracy better than 1 PPM. In particular, its performance is characterized by a stability of $-0.20$ $\mu V/°$ C. without compensation, linearity better than 0.5 PPM, absolute gain better than 1 PPM, noise 0.5 $\mu V$ P-P from 0.003 Hz to 1 Hz, and ripple 0.0053 V P-P.

Numerous other embodiments of the invention will be apparent to persons skilled in the art without departing from the spirit and scope of the invention as defined in the appended claims.

What is claimed is:

1. A D/A converter comprising:
   a DC processing circuit for providing fixed voltage levels including a zero voltage level and two voltage levels having opposite polarity relative to the zero voltage level forming a positive voltage, and a negative voltage;
   a switching device in electrical communication with the DC processing circuit for receiving the three fixed voltage levels, the switching device for receiving a digital signal and for selectively providing at an intermediate port at each of a plurality of successive times one of the voltage levels in dependence upon the digital signal in order to produce a first output signal at the intermediate port, the output signal being a series in time of positive, zero, and negative voltage levels;
   a bootstrap circuit for receiving the first output signal and for providing a second output signal having approximately same content as the first output signal but driven from a different signal driver than the first output signal; and,
   a low-pass filter circuit in electrical communication with the bootstrap circuit, the low-pass filter for receiving the second output signal and for averaging the first output signal in time.

2. A D/A converter as defined in claim 1 wherein the switching device is a quad-switch C-MOS integrated circuit coupled for receiving each of the three voltage levels at each of three input ports thereof and for selectively providing same at an output port thereof.

3. A D/A converter as defined in claim 1 wherein the low-pass filter circuit has a filter response that is of the third order.

4. A D/A converter as defined in claim 3 wherein the low-pass filter provides for substantial filtering of ripple corresponding to switching frequency components within the first output signal.

5. A D/A converter as defined in claim 4 wherein the low-pass filter circuit has a frequency response including a notch for further filtering ripple.

6. A D/A converter as defined in claim 5 wherein the low-pass filter circuit includes a first order filter circuit and a second order filter circuit coupled in parallel.

7. A D/A converter as defined in claim 6 comprising a capacitor for capacitively blocking from the continuous analog output signal a DC drift generated by an amplifier of the second order filter circuit.

8. A D/A converter as defined in claim 6 wherein the bootstrap circuit includes an amplifier and wherein the bootstrap circuit is coupled to the low-pass filter circuit such that a DC drift generated by the amplifier is capacitively blocked from the second output signal.

9. A method for pulse-width modulating a digital signal for generating a continuous analog signal therefrom comprising the steps of:
   receiving the digital signal;
   generating an analog pulse train including a series of pulses being separated by intervals of zero amplitude having a width such that a given instantaneous value of the digital signal is represented by pulse polarity relative to the zero amplitude and a ratio of pulse-width to width; and
   interposing between each two successive pulses a cross-over correction pulse having opposite polarity relative to the zero amplitude and a predetermined fixed pulse-width.

10. A method for pulse-width modulating a digital signal for generating a continuous analog signal therefrom as defined in claim 9 wherein the received digital signal is a 2-bit digital signal in the form of 3 digital pulse trains, one for each switch.

11. A method for pulse-width modulating a digital signal for generating a continuous analog signal therefrom as defined in claim 10 comprising a step of:
   calibrating the circuit to correct a pulse deficit/excess, the correction forming part of a system offset.

12. A method according to claim 10 wherein the predetermined fixed pulse width is a minimum pulse-width.

13. A method according to claim 10 wherein the step of interposing is performed in order to eliminate cross-over discontinuity in the continuous analog signal.

14. A method according to claim 10 wherein the ratio of pulse-width to width is a ration of pulse width to an adjacent width of zero amplitude.

15. A method according to claim 14 wherein the adjacent width of zero amplitude follows the pulse having the pulse width.

16. A method according to claim 10 wherein the step of selectively coupling is performed such that one and only one of the positive voltage level, the zero voltage level, and the negative voltage level are coupled to the intermediate port at the same time.

17. A method according to claim 16 wherein each of the positive voltage level, the zero voltage level, and the negative voltage level are highly accurate voltage levels one relative to another.

18. A method for converting a digital signal into a continuous analog signal comprising the steps of:
receiving the digital signal;
generating an analog pulse train including a series of pulses being separated by intervals of zero amplitude having a width such that a given instantaneous value of the digital signal is represented by pulse polarity relative to the zero amplitude and a ratio of pulse-width to width;
selectively coupling to an intermediate port at each of a plurality of times in sequence one of a positive voltage level, a zero voltage level, and a negative voltage level in dependence upon the digital signal;
driving an analog pulse train at a further intermediate port with a circuit other than the circuit driving the intermediate port in dependence upon a voltage level of the signal at the intermediate port; and,
forming a continuous analog output signal by a step of averaging the analog pulse train.

19. A method for pulse-width modulating a digital signal for generating a continuous analog signal therefrom as defined in claim 18 wherein the received digital signal is a 2-bit digital signal in the form of 3 digital pulse trains, one for each switch.

20. A method according to claim 19 wherein the ratio of pulse-width to width is a ration of pulse width to an adjacent width of zero amplitude.

21. A method according to claim 20 wherein the adjacent width of zero amplitude follows the pulse having the pulse width.

22. A method according to claim 20 wherein the adjacent width of zero amplitude precedes the pulse having the pulse width.

23. A method according to claim 19 wherein the step of averaging is performed using a filter circuit.

24. A method according to claim 23 wherein the filter circuit is a low-pass filter circuit.

25. A method according to claim 19,
wherein the step of averaging is performed using a low-pass filter circuit,
wherein the ratio of pulse-width to width is a ratio of pulse width to an adjacent width of zero amplitude following the pulse having the pulse width, and
wherein the step of selectively coupling is performed such that one and only one of the positive voltage level, the zero voltage level, and the negative voltage level are coupled to the intermediate port at a same time, and comprising the step of:
driving the low-pass filter with a circuit other than the circuit driving the intermediate port in dependence upon a voltage level of the signal at the intermediate port.

26. A method according to claim 25 wherein each of the positive voltage level, the zero voltage level, and the negative voltage level are highly accurate voltage levels one relative to another.

27. A method according to claim 19 comprising the step of:
interposing between each two successive pulses of the digital pulse train a cross-over correction pulse having opposite polarity relative to the zero amplitude and a predetermined fixed pulse-width.

28. A method according to claim 27 wherein the step of interposing is performed in order to eliminate cross-over discontinuity in the continuous analog signal.

29. A method according to claim 19 wherein the step of selectively coupling is performed such that one and only one of the positive voltage level, the zero voltage level, and the negative voltage level are coupled to the intermediate port at a same time.

30. A method according to claim 29 wherein each of the positive voltage level, the zero voltage level, and the negative voltage level are highly accurate voltage levels one relative to another.

* * * * *